(12) United States Patent
Hadrick et al.

(10) Patent No.: US 9,508,409 B2
(45) Date of Patent: Nov. 29, 2016

(54) APPARATUSES AND METHODS FOR IMPLEMENTING MASKED WRITE COMMANDS

(71) Applicant: Micron Technology, Inc., Boise, ID (US)

(72) Inventors: Mark K. Hadrick, Boise, ID (US); Jeffrey P. Wright, Boise, ID (US); Victor Wong, Boise, ID (US); Simon J. Lovett, Meridian, ID (US); Donald M. Morgan, Meridian, ID (US); William F. Jones, Boise, ID (US); Sujeet Ayyapureddi, Boise, ID (US); Dean D. Gans, Nampa, ID (US); Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 100 days.

(21) Appl. No.: 14/254,378

(22) Filed: Apr. 16, 2014

(65) Prior Publication Data
US 2015/0302907 A1 Oct. 22, 2015

(51) Int. Cl.
*G11C 7/22* (2006.01)
*G11C 7/10* (2006.01)
*G11C 8/12* (2006.01)

(52) U.S. Cl.
CPC ............. *G11C 7/22* (2013.01); *G11C 7/1009* (2013.01); *G11C 7/1042* (2013.01); *G11C 8/12* (2013.01); *G11C 2207/229* (2013.01)

(58) Field of Classification Search
CPC .... G06F 13/1689; G06F 3/067; G06F 5/065; G06F 13/4243; G11C 7/22
See application file for complete search history.

(56) References Cited

U.S. PATENT DOCUMENTS

| | | | | |
|---|---|---|---|---|
| 5,412,788 A | * | 5/1995 | Collins | G06F 13/18 711/150 |
| 6,330,636 B1 | * | 12/2001 | Bondurant | G11C 7/1066 711/101 |
| 6,343,352 B1 | * | 1/2002 | Davis | G06F 13/1626 365/194 |

(Continued)

OTHER PUBLICATIONS

International Search Report and Written Opinion issued for PCT/US2015/024694 dated Jun. 18, 2015, 18 pgs.

(Continued)

*Primary Examiner* — Jared Rutz
*Assistant Examiner* — Khoa D Doan
(74) *Attorney, Agent, or Firm* — Dorsey & Whitney LLP (57) ABSTRACT

Apparatuses and methods for implementing masked write commands are disclosed herein. An example apparatus may include a memory bank, a local buffer circuit, and an address control circuit. The local buffer circuit may be associated with the memory bank. The address control circuit may be coupled to the memory bank and configured to receive a command and an address associated with the command. The address control circuit may include a global buffer circuit configured to store the address. The address control circuit may further be configured to delay the command using one of a plurality of command paths based, at least in part, on a write latency and to provide the address stored in the global buffer circuit to the local buffer circuit to be stored therein.

33 Claims, 8 Drawing Sheets

(56) References Cited

U.S. PATENT DOCUMENTS

| | | | | |
|---|---|---|---|---|
| 6,351,427 B1* | 2/2002 | Brown | ................ | G11C 7/1006 365/189.05 |
| 6,868,477 B2 | 3/2005 | Hoskins et al. | | |
| 7,287,103 B2 | 10/2007 | Ganfield et al. | | |
| 7,426,675 B2* | 9/2008 | Harrand | ............. | G06F 11/1008 714/763 |
| 7,464,320 B2* | 12/2008 | Nagai | ................ | G06F 11/1044 714/763 |
| 7,610,542 B2* | 10/2009 | Nagai | ................ | G06F 11/1008 714/763 |
| 8,438,344 B2* | 5/2013 | Kumar | ................ | G06F 11/1052 365/189.02 |
| 8,458,414 B2 | 6/2013 | Jan et al. | | |
| 2001/0021960 A1* | 9/2001 | Manning | ................ | G11C 7/109 711/105 |
| 2007/0140315 A1* | 6/2007 | Janzen | ..................... | G01K 7/00 374/170 |
| 2010/0246275 A1* | 9/2010 | Aybay | ................... | H04L 49/103 365/189.02 |
| 2010/0306458 A1* | 12/2010 | Aho | ........................ | G11C 7/10 711/105 |
| 2012/0317376 A1* | 12/2012 | Loh | ..................... | G06F 13/1657 711/154 |
| 2013/0073926 A1* | 3/2013 | Nemazie | ............. | G11C 29/808 714/773 |
| 2013/0318321 A1* | 11/2013 | Song | ................... | G06F 13/1689 711/167 |

OTHER PUBLICATIONS

"Office Action of the Intellectual Property Office (Translation) received for ROC (Taiwan) Patent Application No. 104111689 dated Mar. 11, 2016".

* cited by examiner

APPARATUSES AND METHODS FOR IMPLEMENTING MASKED WRITE COMMANDS

BACKGROUND

In existing memory systems, memory operations performed in response to memory commands are often performed in a sequential manner. Typically, the sequence in which a memory performs memory operations in response to the memory commands is a reflection of the sequence in which the memory receives commands.

This constraint of existing memory systems has led to challenges in implementing particular memory mechanisms, such as error detection and/or error correction. Indeed, some more recent specifications stipulate implementation of error detection and/or error correction in the form of a masked write command. Briefly, with existing memory architectures designed to sequentially perform memory operations it may be challenging to implement these mechanisms.

SUMMARY

Apparatuses and methods for implementing masked write commands are disclosed herein. An example apparatus includes a memory bank, a local buffer circuit associated with the memory bank, and an address control circuit. The address control circuit is coupled to the memory bank and configured to receive a command and an address associated with the command. The address control circuit includes a global buffer circuit configured to store the address and is configured to delay the command using one of a plurality of command paths based, at least in part, on a write latency and to provide the address stored in the global buffer circuit to the local buffer circuit to be stored therein.

An example apparatus includes an address control circuit and a local buffer circuit. The column address control circuit includes a latency circuit configured to receive a command and to assert a first control signal and a second control signal responsive to receipt of the command. The column address control circuit includes a global buffer circuit coupled to the latency circuit and configured to receive the first control signal and an address associated with the command. The global buffer circuit is configured to store the address responsive to the latency circuit asserting the first control signal. The local buffer circuit is coupled to the latency circuit and the global buffer circuit. The local buffer circuit is associated with a memory bank and configured to receive the second control signal and the address and configured to store the address responsive to the latency circuit asserting the second control signal.

An example apparatus includes an address control circuit. The address control circuit is configured to receive a command and to receive an address associated with the command and indicative of a memory bank of a plurality of memory banks. The address control circuit is further configured to provide the address to a local buffer circuit associated with the memory bank of the plurality of memory banks and to assert a first control signal associated with the memory bank of the plurality of memory banks prior to a write operation associated with the command being performed and to assert a second control signal during the write operation associated with the command, wherein the local buffer circuit provides the address as a local address responsive to the first control signal being asserted and provides a new address as the local address responsive to the second control signal no longer being asserted.

An example apparatus includes an address control circuit. The address control circuit is configured to receive a first command and a second command. The address control circuit is configured to delay the first command a first amount using a first command path and to delay the second command a second amount using a second command path. The address control circuit is further configured to assert a control signal of a first plurality of control signals during an operation associated with the first command and to assert a control signal of a second plurality of control signals during an operation associated with the second command. In some examples, each control signal of the first plurality of control signals is associated with a respective memory bank of a plurality of memory banks and each control signal of the second plurality of control signals is associated with a respective memory bank of the plurality of memory banks.

An example method includes delaying a command of a first type using a first command path, delaying a command of a second type using a second command path, asserting a control signal of a first plurality of control signals during an operation of a first type associated with the first command, each of the plurality of control signals associated with a respective memory bank of a plurality of memory banks, and asserting a control signal of a second plurality of control signals during an operation of a second type associated with the second command, each of the plurality of control signals associated with a respective memory bank of the plurality of memory banks.

An example method includes receiving commands, storing addresses associated with the commands at a global buffer circuit, providing an address stored in the global buffer circuit to a plurality of local buffer circuits, each of the plurality of local buffer circuits associated with a respective memory bank, storing the address at a local buffer circuit of the plurality of local buffer circuits associated with the memory bank corresponding to the address, and providing the address stored at the local buffer circuit of the plurality of local buffer circuits to the respective memory bank as a local address.

DETAILED DESCRIPTION

Apparatuses and methods for implementing masked write commands are disclosed herein. Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Examples of the present invention are related to masked write operations. Generally, a masked write operation includes a read operation followed by a write operation. During the read operation, data are read from a memory array and combined with unmasked data (e.g., write data), and the combined data are used to generate error correction code (ECC) data. During the write operation, both the write data and the ECC data are written to the memory array. Both the read operation and write operation of a masked write operation may be performed in response to a masked write command.

Figure 1:
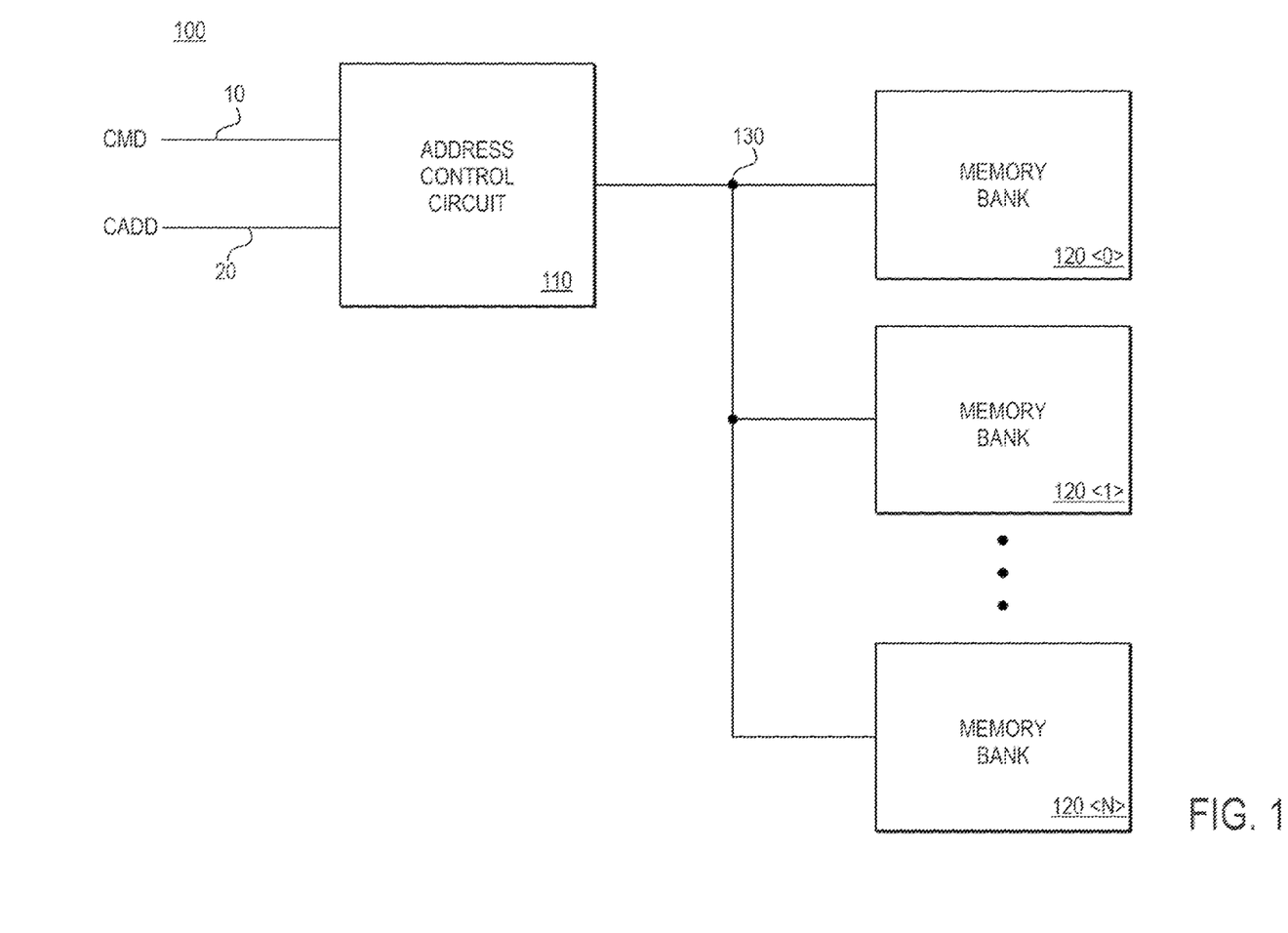
FIG. 1 is a block diagram of an apparatus according to an embodiment of the present invention.

FIG. 1 is a block diagram of an apparatus 100 according to an embodiment of the present invention. The apparatus 100 may include an address control circuit, such as a column address control circuit 110, and a plurality of memory banks 120. The memory banks 120 include memory (not shown in FIG. 1) for storing data, and the memory banks 120 may be included in a memory array, for example, of a memory. The column address control circuit 110 may be coupled to each of the plurality memory banks 120 by the bus 130.

The column address control circuit 110 may be configured to receive commands CMD (e.g., read commands, write commands, or masked write commands) on a command bus 10, and column addresses CADD on an address bus 20 associated with the commands. The column addresses may include a bank address. In response to a command and a column address, the column address control circuit 110 may cause a memory operation to be performed in the memory bank 120 specified by the column address CADD. By way of example, in response to a command and a column address, the column address control circuit 110 may provide the command to memory access control logic (not shown) to initiate the memory operation associated with the command and further may provide the column address to the memory bank 120 indicated by the column address.

Generally, memory operations may occur sequentially. That is, the order of commands received by the column address control circuit 110 may be the order in which memory operations are performed. In some instances, however, memory operations may occur in an order differing from the order in which commands are received. A masked write command following a write command may, for instance, cause a read operation to occur before or during a write operation associated with the write command. Such operations may be directed to different memory banks 120 or may be directed to a same memory bank 120. In either case, if column addresses are merely provided internally for operation in the sequence received by the column address control circuit 110, column address conflicts may result.

Accordingly, as will be explained in more detail below, the column address control circuit 110 may be configured to control the manner in which memory operations occur at each of the memory banks 120 such that column address conflicts are avoided. In at least one example, the column address control circuit 110 may be configured to cause each memory bank 120 to store column addresses associated with the respective memory bank 120 (as indicated by a bank address of each column address). Additionally or alternatively, the column address control circuit 110 may include separate command paths for read commands, write commands, and masked write commands such that read commands, write commands, and masked write commands may be independently delayed. The column address control circuit 110 further may be configured to provide column access signals indicating whether a memory bank 120 is performing a read operation and provide column access signals indicating whether a memory bank 120 is performing a write operation. Providing column access signals in this manner may allow memory banks 120 to perform read and write operations independently of one another.

Figure 2:
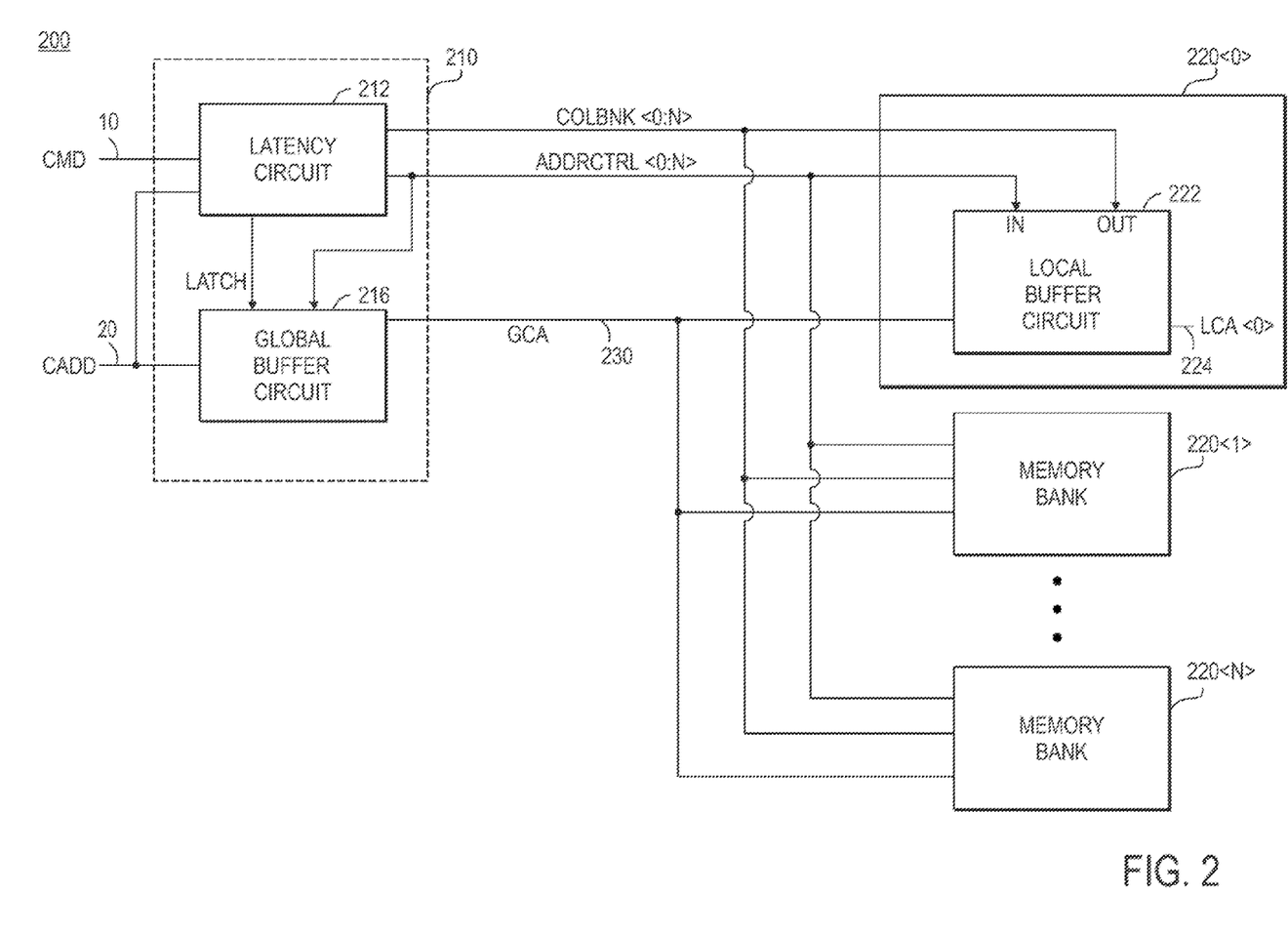
FIG. 2 is a block diagram of an apparatus according to an embodiment of the present invention.

FIG. 2 is a block diagram of an apparatus 200 according to an embodiment of the present invention. The apparatus 200 may include a column address control circuit 210 and a plurality of memory banks 220. The column address control circuit 210 and the plurality of memory banks 220 may be used as the column address control circuit 110 and the plurality of memory banks 120 of FIG. 1, respectively.

The column address control circuit 210 may include a latency circuit 212 and a global buffer circuit 216. The global buffer circuit 216 may be configured as a first-in, first-out (FIFO) buffer in some embodiments. The latency circuit 212 may be configured to receive commands CMD from the command bus 10 and column addresses CADD from the address bus 20 and further may be configured to assert control signals COLBNK, ADDRCTRL, and LATCH. The control signal COLBNK<0:N> may be a column access control signal and may be associated with a respective memory bank 220<0:N>, and similarly, each of the plurality of control signals ADDRCTRL<0:N> may be associated with a respective memory bank 220<0:N>. As an example, the control signals COLBNK<0> and ADDRCTRL<0> may be associated with memory bank 220<0>, the control signals COLBNK<1> and ADDRCTRL<1> may be associated with memory bank 220<1>, the control signals COLBNK<2> and ADDRCTRL<2> may be associated with memory bank 220<2>, and so on. The latency circuit 212 may include bank address decoding logic (not shown in FIG. 2) for decoding commands and column addresses that in some examples, may be configured to assert a control signal COLBNK during an operation of the memory bank 220 associated with the respective command.

The latency circuit 212 may be configured to assert a control signal ADDRCTRL in response to receiving a command and based on a column address associated with the command. That is, in response to a command, the latency circuit may assert the control signal ADDRCTRL associated with the memory bank 220 specified by the bank address of the column address. In some examples, a control signal ADDRCTRL may be asserted a period of time (e.g., 2 clock cycles) after a command has been received. The latency circuit 212 may be configured to assert the control signal LATCH responsive to receipt of a command from the command bus 10.

The global buffer circuit 216 may be included in the column address control circuit 210, and may be configured to receive column addresses CADD on the address bus 20, and further receive the control signals ADDRCTRL and LATCH. The global buffer circuit 216 may be configured to store each column address CADD provided on the address bus 20 in response to an asserted control signal LATCH, and as will be explained, further may provide stored column addresses responsive to one or more of the plurality of control signals ADDRCTRL<0:N> no longer being asserted. Column addresses provided by the global buffer circuit 216 may be provided to a global column address bus 230.

Each of the memory banks 220 may be associated with a respective local buffer circuit 222 that may be coupled to the latency circuit 212 and the global buffer circuit 216. Each local buffer circuit 222 may be configured to receive a respective control signal COLBNK and a respective control signal ADDRCTRL. Responsive to the respective control signal ADDRCTRL being asserted, a local buffer circuit 222 may store a column address provided by the global buffer circuit 216 on the global column address bus 230. Further, in response to a respective control signal COLBNK no longer being asserted, each local buffer circuit 222 may provide a stored column address as a local column address LCA. Local column addresses LCA provided by each local buffer circuit 222 may be provided to a respective local column address bus 224. The local column address may be used by circuits to access the memory location in the associated memory bank 220 corresponding to the local column address.

The global buffer circuit 216 and each of the local buffer circuits 222 may include one or more first-in-first-out (FIFO) buffers (not shown) configured to store one or more column addresses. Generally, each of the FIFO buffers may have any depth and may store and provide column addresses in accordance with a first-in-first-out (FIFO) convention. Further, each of the FIFO buffers may be configured to automatically provide a first stored column address. That is, after initialization, the first column address stored in a FIFO buffer may be automatically provided from the FIFO buffer until a new column address is provided in response to a control signal as described herein. A column address subsequently provided to the FIFO buffer will not be provided until previously stored column addresses of the FIFO buffer have been provided. If a FIFO buffer has not yet received a column address or if all column addresses have been provided such that no addresses are stored in the FIFO buffer, the FIFO buffer may provide a nonsensical value or may enter a high impedance state.

As described, in some instances, a masked write command may follow a write command which may result in non-sequential and/or simultaneous operations. A non-sequential operation may occur when a masked write command follows a write command and a read operation associated with the masked write command occurs prior to a write operation associated with the write command. Similarly, a simultaneous operation may occur when a masked write command follows a write command and the read operation associated with the masked write command occurs concurrently with the write operation associated with the write command.

Figure 3:
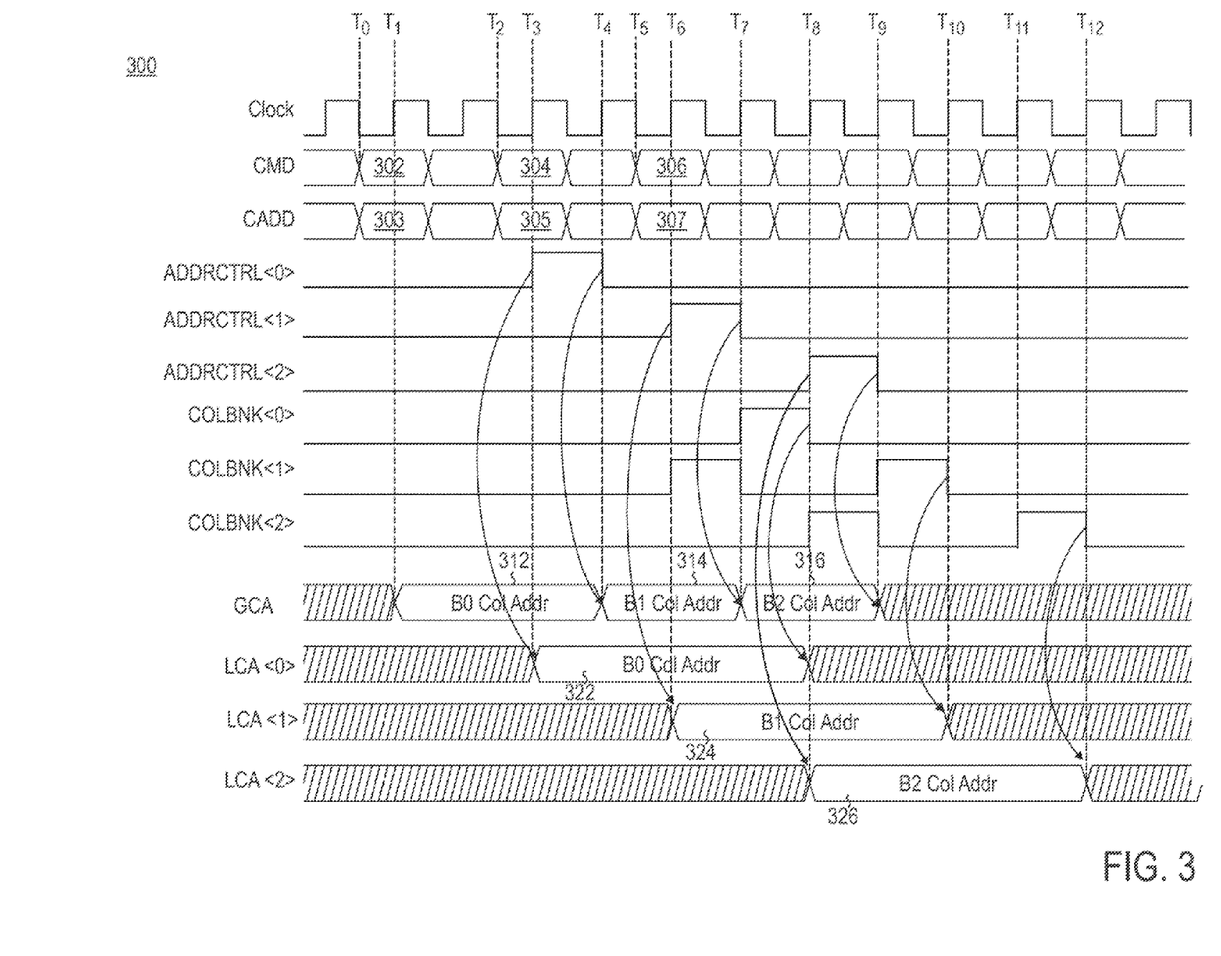
FIG. 3 is a timing diagram of an example operation in which non-sequential operations occur according to an embodiment of the present invention.

FIG. 3 is a timing diagram 300 of an example operation in which non-sequential operations occur according to an embodiment of the present invention. The timing diagram 300 is described with reference to the apparatus 200 and is for an example operation of three memory banks 220, in particular, memory bank 220<0>, memory bank 220<1>, and memory bank 220<2>. It will be appreciated, however, that other examples may not be limited to these particular memory banks 220 or this number of memory banks 220.

At time T0, the latency circuit 212 may receive a command 302 on the command bus 10. The command 302 may be a write command. Additionally, the latency circuit 212 and the global buffer circuit 216 may receive a column address 303 associated with the command 302. As described, the latency circuit 212 may identify a memory bank 220 based on a bank address included in the column address 303. At time T1, the latency circuit 212 may assert a control signal LATCH, and in response to assertion of the control signal LATCH, the global buffer circuit 216 may store the address 303. Assuming that no other column addresses are stored in the global buffer circuit 216, the global buffer circuit 216 may provide the column address 303 as the column address 312 for global column address GCA on the global column address bus 230. Although the control signal LATCH is described herein as being asserted at the time T1, in some examples, the control signal LATCH may alternatively be asserted on the falling edge after the time T1 or on the rising edge after the time T1.

At time T2, the latency circuit 212 may receive a command 304 on the command bus 10. The command 304 may be a masked write command. The latency circuit 212 and the global buffer circuit 216 may receive a column address 305 associated with the command 304. The latency circuit 212 may identify a memory bank 220 based on a bank address included in the column address 305 and further may again assert the control signal LATCH. In response to assertion of the control signal LATCH, the global buffer circuit 216 may store the column address 305. Because the column address 303 is stored in the global buffer circuit 216, the global buffer circuit 216 may store the column address 305 but may not provide the column address 305 to the global column address bus 230. Instead, the global buffer circuit 216 may continue to provide the column address 303 to the global column address bus 230.

At time T3, the latency circuit 212 may assert the control signal ADDRCTRL<0>. In response, the local buffer circuit 222 associated with the memory bank 220<0> may store the column address 312 (corresponding to column address 303). Because no other column addresses are stored in the local buffer circuit 222 associated with the memory bank 220<0>, the local buffer circuit 222 may provide the column address 312 as column address 322 for the local column address LCA<0>.

At time T4, the latency circuit 212 may no longer assert ADDRCTRL<0>, and in response, the global buffer circuit 216 may provide a new column address. Accordingly, the global buffer circuit 216 may provide the column address 305 to the global column address bus 230 as the column address 314.

At time T5, the latency circuit 212 may receive a command 306 on the command bus 10. The command 306 may be a masked write command. Additionally, the latency circuit 212 and the global buffer circuit 216 may receive a column address 307 associated with the command 306. The latency circuit 212 may identify a memory bank 220 based on a bank address included in the column address 307 and may again assert the control signal LATCH. In response to assertion of the control signal LATCH, the global buffer circuit 216 may store the column address 307. Because the column address 305 is stored in the global buffer circuit 216, the global buffer circuit 216 may store the column address 307 but may not provide the column address 307 to the global column address bus 230. Instead, the global buffer circuit 216 may continue to provide the column address 305 to the global column address bus 230.

At time T6, the latency circuit 212 may assert the control signal ADDRCTRL<1>. In response, the local buffer circuit 222 associated with memory bank 220<1> may store the column address 314 (corresponding to column address 305). Because no other column addresses are stored in the local buffer circuit 222 associated with the memory bank 220<1>, the local buffer circuit 222 may provide the column address 314 as column address 324 for the local column address LCA<1>. Additionally, the latency circuit 212 may assert the control signal COLBNK<1> of the control signal COLBNK during the read operation associated with the command 304.

At time T7 after the read operation associated with the command 304 completes, the latency circuit 212 may no longer assert COLBNK<1>. Because the completed operation was a read, the local buffer circuit 222 associated with memory bank 220<1> may continue to provide the column address 324 for the local column address LCA<1>. Also, the latency circuit 212 may no longer assert ADDRCTRL<1> and in response, the global buffer circuit 216 may provide a new column address. Accordingly, the global buffer circuit 216 may provide the column address 307 to the global column address bus 230 as the column address 316. The latency circuit 212 may assert the control signal COLBNK<0> signal during the write operation associated with the command 302.

At time T8, the latency circuit 212 may assert the control signal ADDRCTRL<2>. In response, the local buffer circuit 222 associated with memory bank 220<2> may store the column address 316 (corresponding to column address 307). The stored column address 316 is provided by the local buffer circuit 222 as column address 326 for local column address LCA<2>. The latency circuit 212 may further assert the control signal COLBNK<2> of the control signal COLBNK during the read operation associated with the command 306, and no longer assert COLBNK<0> in response to the write operation associated with the command 302 having been completed. In response to the transition of COLBNK<0>, the local buffer circuit 222 associated with the memory bank 220<0> may provide a new column address.

At time T9, after the read operation associated with the command 304 completes, the latency circuit 212 may no longer assert COLBNK<2>. Because the completed operation was a read, the local buffer circuit 222 associated with memory bank 220<2> may continue to provide the column address 326 for the local column address LCA<2>. The latency circuit 212 may further no longer assert ADDRCTRL<2> and in response, the global buffer circuit 216 may provide a new column address. The latency circuit 212 may assert COLBNK<1> during the write operation associated with the command 304.

At time T10, the latency circuit 212 may no longer assert COLBNK<1> in response to the write operation associated with the command 304 having been completed. In response to the transition of COLBNK<1>, the local buffer circuit 222 associated with memory bank 220<1> may provide a new column address. At time T11, the latency circuit 212 may assert COLBNK<2> during the write operation associated with the command 306. At time T12, the latency circuit 212 may no longer assert COLBNK<2> in response to the write operation associated with the command 306 having been completed. In response to the transition of COLBNK<2>, the local buffer circuit 222 associated with memory bank 220<2> may provide a new column address.

Figure 4:
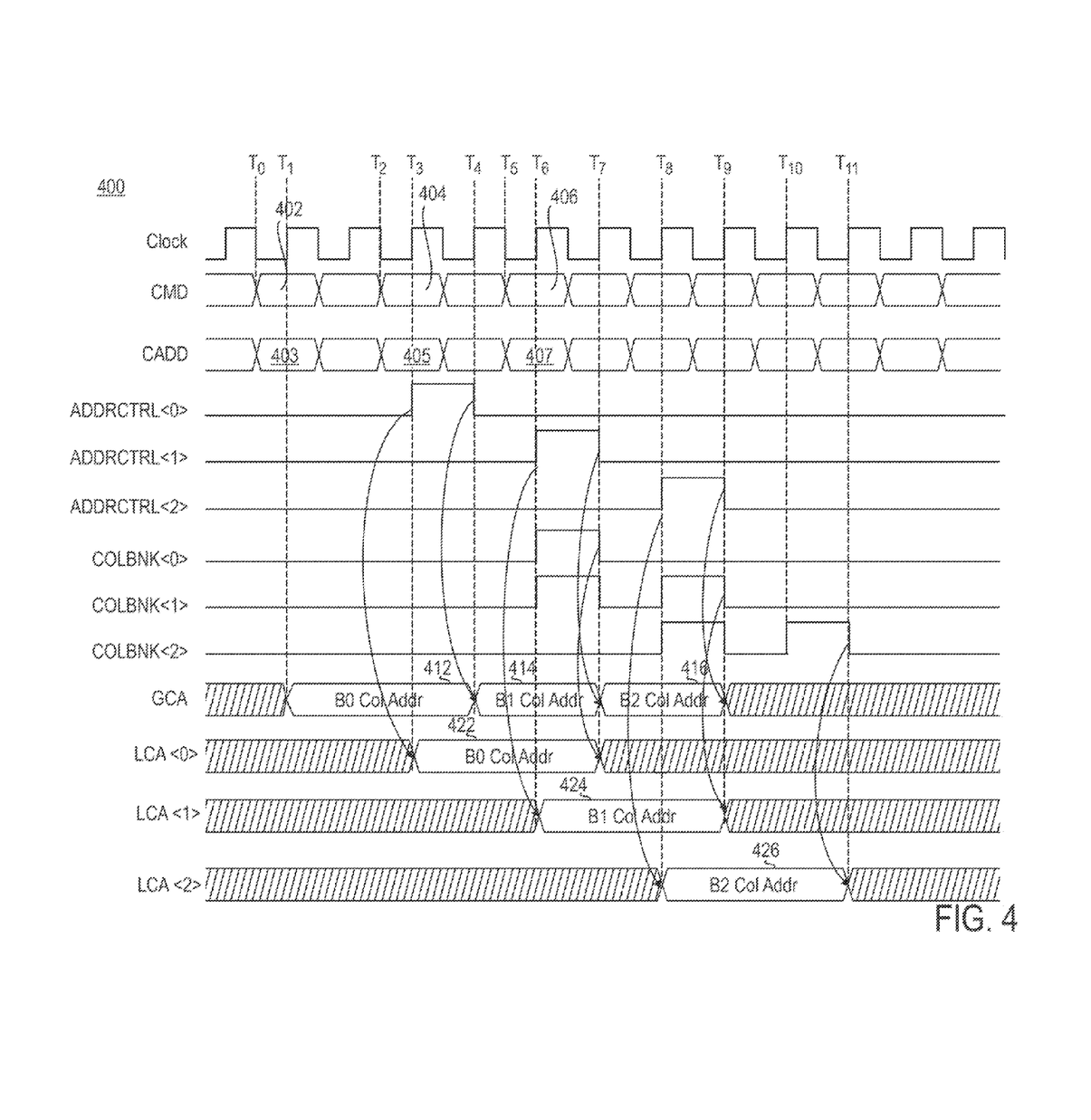
FIG. 4 is a timing diagram of an example operation in which simultaneous column access according to an embodiment of the present invention.

FIG. 4 is a timing diagram 400 of an example operation in which simultaneous operations occur according to an embodiment of the present invention. The timing diagram 400 is described with reference to the apparatus 200 and is for an example operation of three memory banks 220, in particular, memory bank 220<0>, memory bank 220<1>, and memory bank 220<2>. It will be appreciated, however, that other examples may not be limited to these particular memory banks 220 or this number of memory banks 220.

At time T0, the latency circuit 212 may receive a command 402 on the command bus 10. The command 402 may be a write command. Additionally, the latency circuit 212 and the global buffer circuit 216 may receive a column address 403 associated with the command 402. As described, the latency circuit 212 may identify a memory bank 220 based on a bank address included in the column address 403. At time T1, the latency circuit 212 may assert a control signal LATCH, and in response to assertion of the control signal LATCH, the global buffer circuit 216 may store the address 403. Because no other column addresses are stored in the global buffer circuit 216, the global buffer circuit 216 may provide the column address 403 as the column address 412 for global column address GCA on the global column address bus 230. Although the control signal LATCH is described herein as being asserted at the time T1, in some examples, the control signal LATCH may alternatively be asserted on the falling edge after the time T1 or on the rising edge after the time T1.

At time T2, the latency circuit 212 may receive a command 404 on the command bus 10. The command 404 may be a masked write command. The latency circuit 212 and the global buffer circuit 216 may receive a column address 405 associated with the command 404. The latency circuit 212 may identify a memory bank 220 based on a bank address included in the column address 405 and further may again assert the control signal LATCH. In response to assertion of the control signal LATCH, the global buffer circuit 216 may store the column address 405. Because the column address 403 is stored in the global buffer circuit 216, the global buffer circuit 216 may store the column address 405 but may not provide the column address 405 to the global column address bus 230. Instead, the global buffer circuit 216 may continue to provide the column address 403 to the global column address bus 230.

At time T3, the latency circuit 212 may assert the control signal ADDRCTRL<0>. In response, the local buffer circuit 222 associated with memory bank 220<0> may store the column address 412 (corresponding to column address 403). Because no other column addresses are stored in the local buffer circuit 222, the local buffer circuit 222 associated with the memory bank 220<0> may provide the column address 412 as column address 422 for the local column address LCA<0>.

At time T4, the latency circuit 212 may no longer assert ADDRCTRL<0>, and in response the global buffer circuit 216 may provide a new column address. Accordingly, the global buffer circuit 216 may provide the column address 405 to the global column address bus 230 as the column address 414.

At time T5, the latency circuit 212 may receive a command 406 on the command bus 10. The command 406 may be a masked write command. Additionally, the latency circuit 212 and the global buffer circuit 216 may receive a column address 407 associated with the command 406. The latency circuit 212 may identify a memory bank 220 based on a bank address included in the column address 407 and may again assert the control signal LATCH. In response to assertion of the control signal LATCH, the global buffer circuit 216 may store the column address 407. Because the column address 405 is stored in the global buffer circuit 216, the global buffer circuit 216 may store the column address 407 but may not provide the column address 407 to the global column address bus 230. Instead, the global buffer circuit 216 may continue to provide the column address 405 to the global column address bus 230.

At time T6, the latency circuit 212 may assert ADDRC-TRL<1>. In response, the local buffer circuit 222 associated with memory bank 220<1> may store the column address 414 (corresponding to column address 405). Because no other column addresses are stored in the local buffer circuit 222, the local buffer circuit 222 may provide the column address 414 as column address 424 for the local column address LCA<1>. The latency circuit 212 may assert the control signals COLBNK<0> and COLBNK<1> during the write operation associated with the command 402 and the read operation associated with the command 404, respectively.

At time T7, after the write operation associated with the command 402 and the read operation associated with the command 404 are completed, the latency circuit 212 may no longer assert COLBNK<0> and COLBNK<1>. In response to COLBNK<0> no longer being asserted, the local buffer circuit 222 associated with memory bank 220<0> may provide a new column address. Because the completed operation associated with the command 404 was a read operation, the local buffer circuit 222 associated with memory bank 220<1> may continue to provide the column address 424 for the local column address LCA<1>.

At time T5, the latency circuit 212 may assert ADDRC-TRL<2>. In response, the local buffer circuit 222 associated with memory bank 220<2> may store the column address 416 (corresponding to column address 407). The stored column address 416 is provided by the local buffer circuit 222 as column address 426 for local column address LCA<2>. The latency circuit 212 may further assert COLBNK<1> and COLBNK<2> during the write operation associated with the command 404 and the read operation associated with the command 406, respectively.

At time T9, after the write operation associated with the command 404 and the read operation associated with the command 406 completes, the latency circuit 212 may no longer assert COLBNK<1> and COLBNK<2>. In response to COLBNK<1> no longer being asserted, the local buffer circuit 222 associated with memory bank 220<1> may provide a new column address. Because the completed operation associated with the command 406 was a read operation, the local buffer circuit 222 associated with memory bank 220<2> may continue to provide the column address 424 for the local column address LCA<2>. The latency circuit 212 may further no longer assert ADDRC-TRL<2> and in response, the global buffer circuit 216 may provide a new column address.

At time T10, the latency circuit 212 may assert COLBNK<2> during the write operation associated with the command 406. At time T11, the latency circuit 212 may no longer assert COLBNK<2> in response to the write operation associated with the command 406 having been completed. In response to the transition of COLBNK<2>, the local buffer circuit 222 associated with memory bank 220<2> may provide a new column address.

Accordingly, because the column address control circuit 210 may cause each memory bank 220 to store column addresses associated with the respective memory bank 220, both non-sequential and simultaneous operations may be performed.

Figure 5:
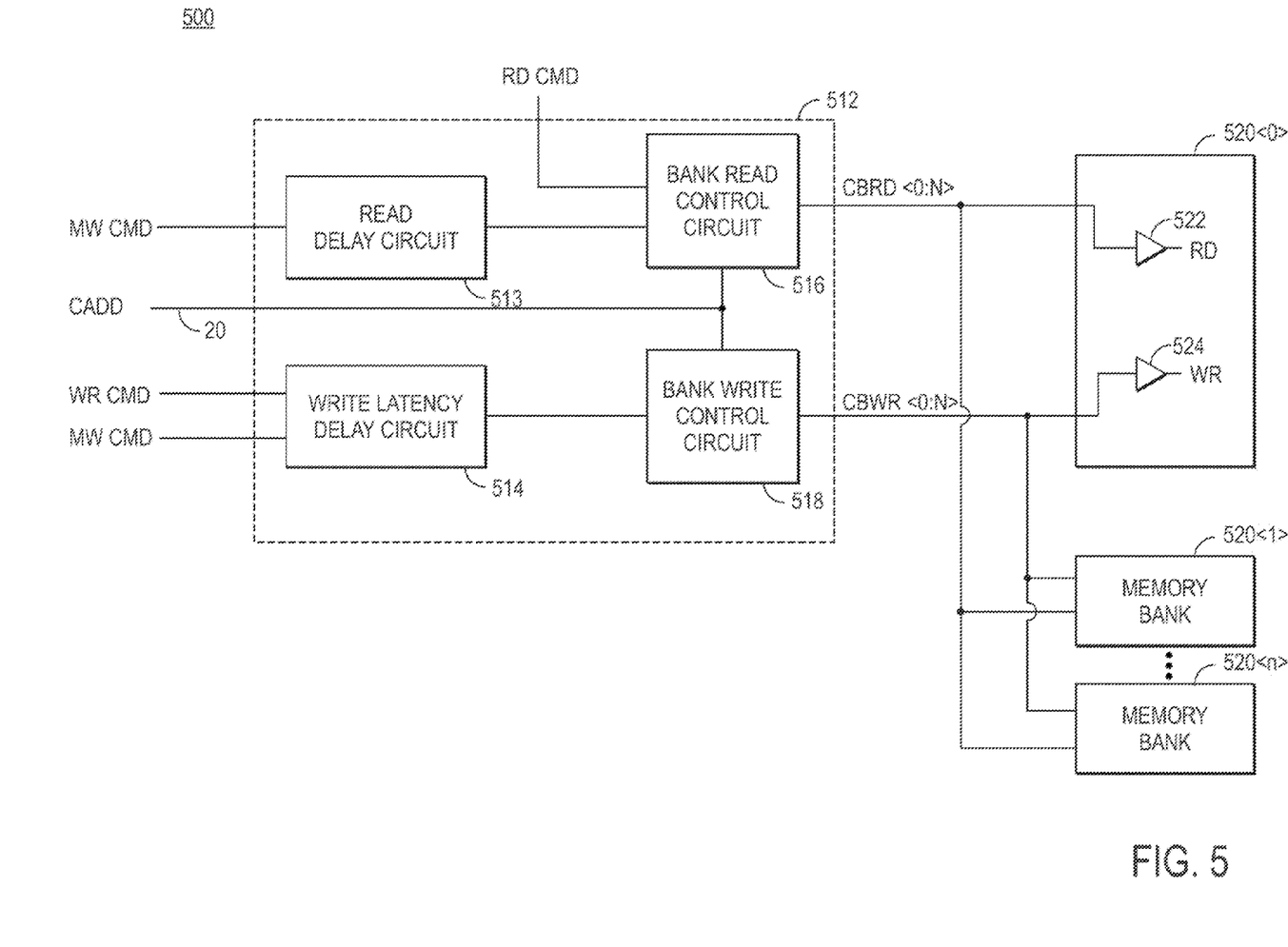
FIG. 5 is a block diagram of an apparatus according to an embodiment of the present invention.

FIG. 5 is a block diagram of an apparatus 500 according to an embodiment of the present invention. The apparatus 500 may include a latency circuit 512 and a plurality of memory banks 520. The latency circuit 512 may be included in, at least in part, the column access control circuit 110 of FIG. 1 and/or the latency circuit 212 of FIG. 2. The plurality of memory banks 520 may be used to implement the plurality of memory banks 220 of FIG. 2, respectively. The latency circuit 512 may include a read delay circuit 513, a write delay circuit 514, a bank read control circuit 516, and a bank write control circuit 518.

Elements of the latency circuit 512 may be configured to receive particular types of commands. By way of example, the read delay circuit 513 may be configured to receive masked write commands MW CMD, the write delay circuit 514 may be configured to receive write commands WR CMD and masked write commands MW CMD, and the bank read control circuit 516 may be configured to receive read commands RD CMD. Thus, in some examples, the latency circuit 512 may include control logic (not shown in FIG. 5) for identifying and/or distributing commands to respective elements of the latency circuit 512 as described.

The read delay circuit 513 may be configured to receive masked write commands and delay the masked write commands based on a write latency setting of the memory banks 520 to provide delayed masked write read commands. Delayed masked write read commands, may for instance, be provided by the read delay circuit 513 to cause a read operation associated with a masked write command. The write delay circuit 514 may be configured to receive write commands and masked write commands and delay the write commands and masked write commands based on the write latency setting of the memory banks 520 to provide delayed write commands and delayed masked write write commands, respectively. Delayed masked write write commands, may for instance, be provided by the write delay circuit 514 to cause a write operation associated with a masked write command. The respective delays provided by the read delay circuit 513 and write delay circuit 514 may delay respective commands such that masked write read commands have a same relative timing with respect to masked write write commands as write latency of the memory banks 520 is adjusted.

The bank read control circuit 516 may be coupled to the read delay circuit 513 and configured to receive delayed masked write read commands therefrom. The bank read control circuit 516 may further be configured to receive read commands. The bank read control circuit 516 may further be coupled to each of the plurality of memory banks 520 and configured to receive column addresses CADD from the column address bus 20. The bank read control circuit 516 may be configured to assert one or more of a plurality of control signals CBRD based on received commands and column addresses associated with the received commands. Each of the plurality of control signals CBRD may be associated with a respective memory bank 520 and may be provided to a respective driver, for example, driver 522 associated with the respective memory bank 520. The driver 522 provides the control signal CBRD as a read activation signal RD that may be used during a read operation to the memory bank 520. The control signals CBRD may indicate whether an associated bank is performing a read operation in response to either a read command or a delayed masked write read command. By way of example, the bank read control circuit 516 may assert a control signal CBRD<0> in response to receipt of a read command or delayed masked write read command associated with memory bank 520<0> as indicated by the associated column address.

The bank write control circuit 518 may be coupled to the write delay circuit 514 and configured to receive delayed write commands and delayed masked write write commands therefrom. The bank write control circuit 518 may further be coupled to each of the plurality of memory banks 520 and configured to receive column addresses from the column address bus 20. The bank write control circuit 518 may be configured to assert one or more of a plurality of control signals CBWR based on received commands and column addresses associated with the received commands. Each of the plurality of control signals CBWR may be associated with a respective memory bank 520 and may be provided to a respective driver, for example, driver 524 associated with the respective memory bank 520. The driver 524 provides the control signal CBWR as a write activation signal WR that may be used during a write operation to the memory bank 520. The control signals CBWR may indicate whether an associated bank is performing a write operation in response to either a write command or a delayed masked write write command. By way of example, the bank write control circuit 518 may assert a control signal CBWR<0> in response to receipt of a delayed write command or a delayed masked write write command associated with memory bank 520<0> as indicated by the associated column address.

By providing separate command paths for read commands, write commands, and masked write commands, the read commands, write commands, and masked write commands may be delayed independently, and simultaneous read operations and write operations occurring at a same memory bank 520 may be avoided. Moreover, providing separate command paths may allow separate control signals to be provided for read and write operations of each memory bank 520. That is, separate command paths allow for the plurality of control signals CBRD to be provided from the bank read control circuit 516 and for the plurality of control signals CBWR to be provided from the bank write control circuit 518, and as a result, the latency circuit 512 may indicate whether each bank is performing a read operation or a write operation at a given time. As a result, each of the memory banks 520 may perform read and write operations independently of one another. In some examples, this may allow read operations and write operations to be performed simultaneously in different memory banks 520.

Figure 6:
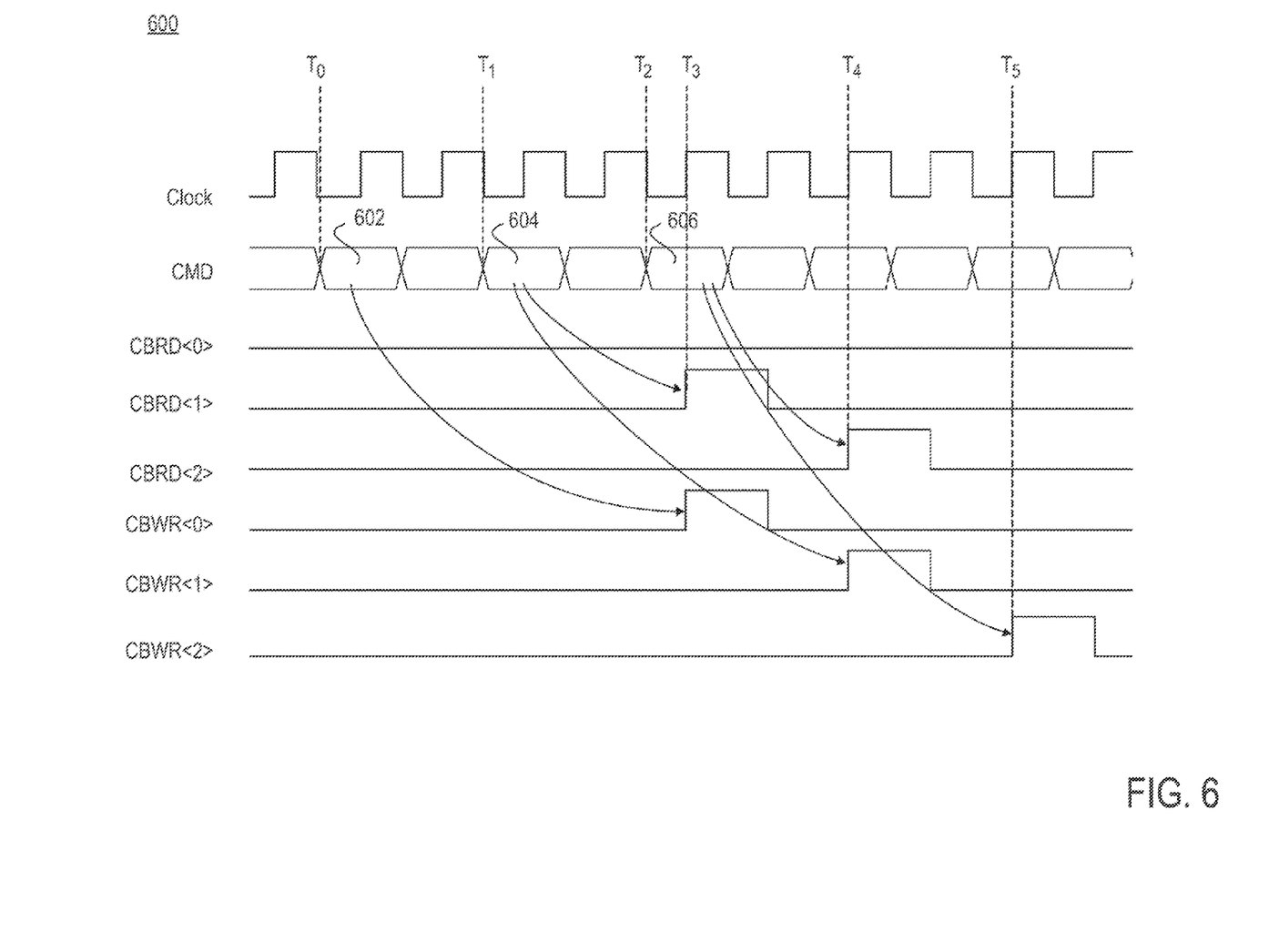
FIG. 6 is a timing diagram of an example operation in which simultaneous operations occur according to an embodiment of the present invention.

FIG. 6 is a timing diagram 600 of an example operation in which simultaneous operations occur according to an embodiment of the present invention. The timing diagram 600 is described with reference to the apparatus 500 and is for an example operation of three memory banks 520, in particular, memory bank 520<0>, memory bank 520<1>, and memory bank 520<2>. It will be appreciated, however, that other examples may not be limited to this number of memory banks 520.

At time T0, the write delay circuit 514 may receive a command 602. The command 602 may be a write command. The write delay circuit 514 may delay the write command based on a write latency setting to provide a delayed write command. In turn, the bank write control circuit 518 may receive the delayed write command and a column address associated with the command 602. The bank write control circuit 518 may provide the delayed write command to initiate a write operation in the memory bank 520 specified by the column address.

At times T1 and T2, the read delay circuit 513 and the write delay circuit 514 may both receive commands 604 and 606, respectively. Each of the commands 604, 606 may be masked write commands. The read delay circuit 513 may delay each of the commands 604, 606 based on the write latency setting to provide respective delayed masked write read commands. In turn, the bank read control circuit 516 may receive each of the delayed masked write read commands and column addresses associated with each of the commands 604, 606. The bank read control circuit 516 may provide each of the delayed masked write read commands to initiate read operations in the memory banks 520 specified by the column addresses, respectively.

Additionally, the write delay circuit 514 may delay each of the commands 604, 606 based on the write latency setting to provide respective delayed masked write write commands. The delay applied by the write delay circuit 514 may be the same as the delay applied to the write command 602 at time T0. In turn, the bank write control circuit 518 may receive each of the delayed masked write write commands and column addresses associated with each of the commands 604, 606. The bank write control circuit 518 may provide each of the delayed masked write write commands to initiate write operations in the memory banks 520 specified by the column addresses, respectively.

At time T3, the bank write control circuit 518 may assert CBWR<0> during the write operation associated with the command 602. The bank read control circuit 516 may assert CBRD<1> during the read operation associated with the command 604. At time T4, the bank write control circuit 518 may assert CBWR<1> during a write operation associated with the command 604. The bank read control circuit 516 may assert CBRD<2> during a read operation associated with the command 606. At time T5, the bank write control circuit 518 may assert CBWR<2> during a write operation associated with the command 606.

Thus as illustrated in the timing diagram 600, providing control signals indicating whether each memory bank 520 is performing a read operation or a write operation may allow different banks to perform read operations and write operations simultaneously. At the time T3, for instance, a read operation associated with the command 604 may be performed at the memory bank 520<1> and a write operation associated with the command 602 may be performed at the memory bank 520<0> simultaneously.

Figure 7:
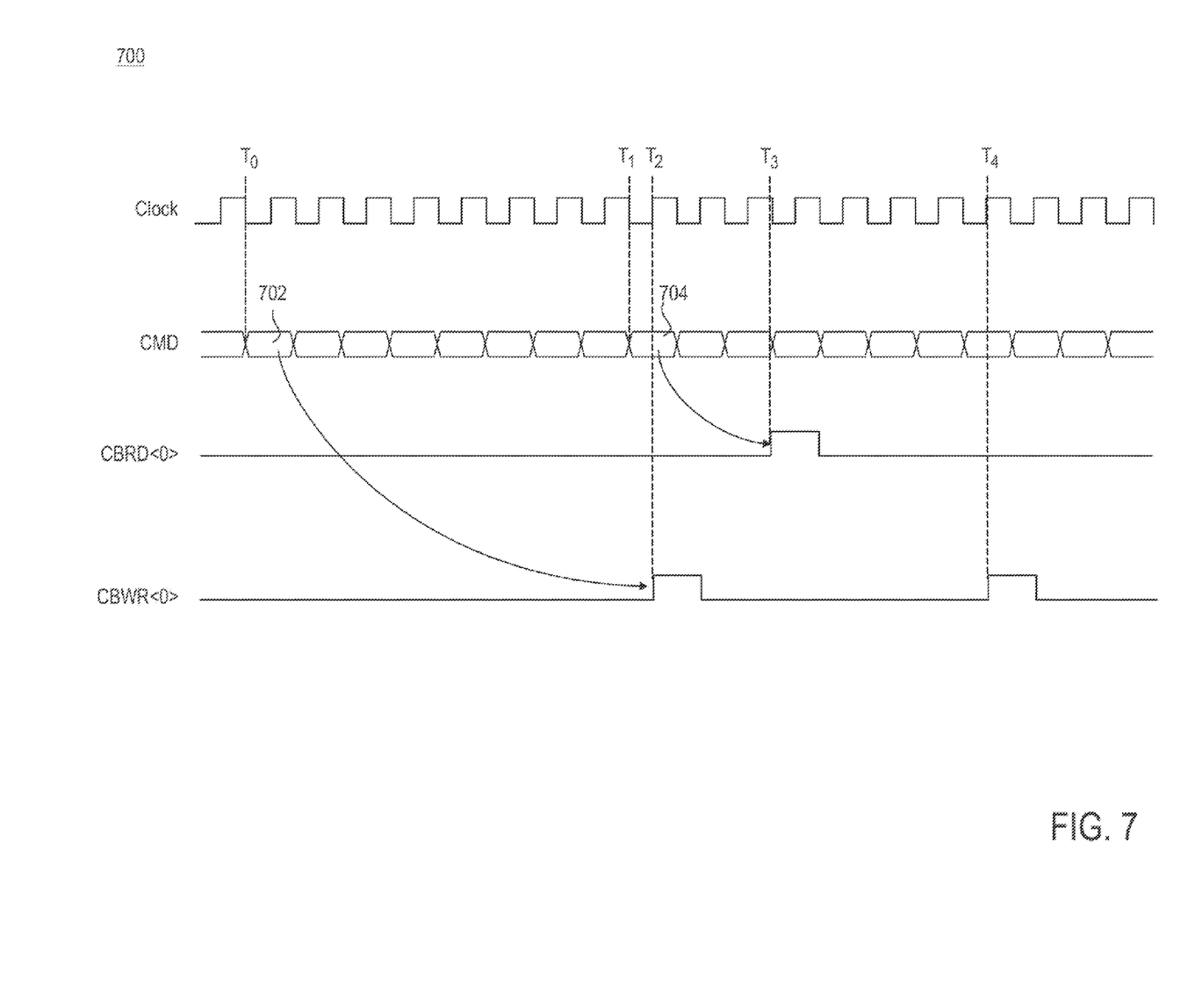
FIG. 7 is a timing diagram of an example operation in which non-sequential operations occur according to an embodiment of the present invention.

FIG. 7 is a timing diagram 700 of a non-sequential column access according to an embodiment of the present invention. The timing diagram 700 is described with reference to the apparatus 500 and is for an example operation of a memory bank 520, in particular, memory bank 220<0>. It will be appreciated, however, that other examples may not be limited to this number of memory banks 520.

At time T0, the write delay circuit 514 may receive a command 702. The command 702 may be a write command. The write delay circuit 514 may delay the write command based on a write latency setting of the memory banks 520 to provide a delayed write command. In turn, the bank write control circuit 518 may receive the delayed write command and a column address associated with the command 702. The bank write control circuit 518 may provide the delayed write command to initiate a write operation in the memory bank 520 specified by the column address.

At time T1, the read delay circuit 513 may receive a command 704. The command 702 may be a masked write command. The read delay circuit 513 may delay the command 704 based on the write latency setting of the memory banks 520 to provide a delayed masked write read command. In turn, the bank read control circuit 516 may receive the delayed masked write read command and a column address associated with the command 704. The bank read control circuit 516 may provide the delayed masked write read command to initiate a read operation in the memory bank 520 specified by the column address.

Additionally, the write delay circuit 514 may receive the command 704 and delay the command 704 based on the write latency setting of the memory banks 520 to provide a delayed masked write write command. The delay applied by the write delay circuit 514 may be the same as the delay applied to the write command 702 at time T0. In turn, the bank write control circuit 518 may receive the delayed masked write write command and a column address associated with the commands 704. The bank write control circuit 518 may provide the delayed masked write write command to initiate a write operation in the memory banks 520 specified by the column address.

At time T2, the bank write control circuit 518 may assert CBWR<0> during a write operation associated with the command 702. At a time T3 after the write operation associated with the command 702 has completed, the bank read control circuit 516 may assert CBRD<0> during a read operation associated with the command 704. At a time T4, the bank write control circuit 518 may assert CBWR<0> during a write operation associated with the command 704.

As described, the read delay circuit 513 and write delay circuit 514 may each delay respective commands based on a write latency of the memory banks 520. By providing delays in this manner, instances in which a masked write command follows a write command and each of the commands are directed to a same memory bank 520, the latency circuit 512 may ensure that read and write operations at a same memory bank 520 do not occur simultaneously.

Figure 8:
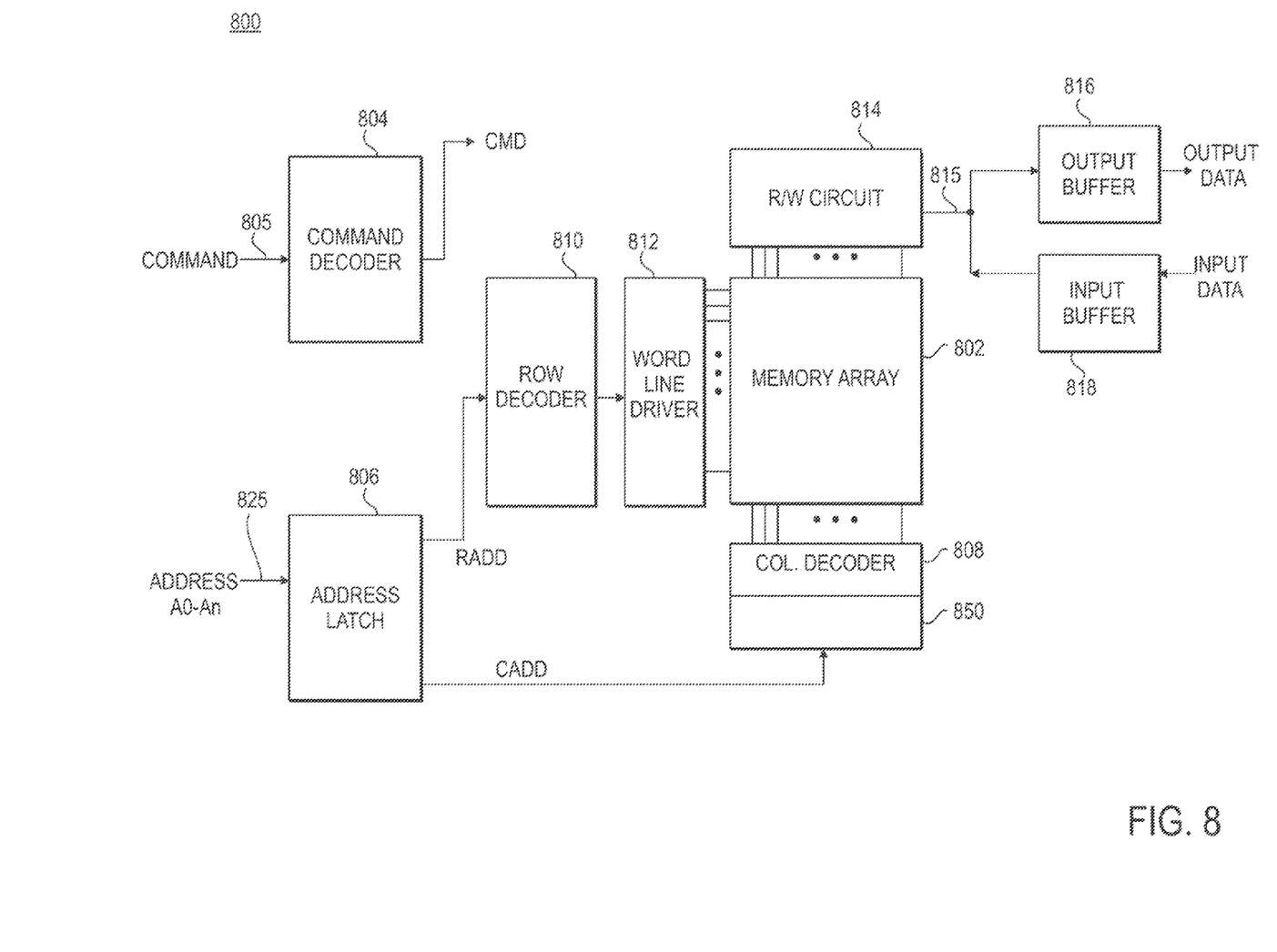
FIG. 8 is a block diagram of a memory according to an embodiment of the present invention.

FIG. 8 illustrates a memory 800 according to an embodiment as discussed herein. The memory 800 includes an array 802 of memory cells, which may be, for example, volatile memory cells (e.g., DRAM memory cells, SRAM memory cells), non-volatile memory cells (e.g., flash memory cells), or some other types of memory cells. The memory system 800 includes a command decoder 804 that receives memory commands through a command bus 805 and generates commands CMD within the memory system 800 to carry out various memory operations. The command decoder 804 responds to memory commands applied to the command bus 805 to perform various operations on the memory array 802. For example, the command decoder 804 is used to generate commands CMD to read data from and write data to the memory array 802. Row and column address signals are applied to the memory system 800 through an address bus 825 and provided to an address latch 806. The address latch then outputs a column address CADD and a separate row address RADD.

The row address RADD and the column address CADD are provided by the address latch 806 to a row address decoder 810 and a column address decoder 808, respectively. The column address decoder 808 selects bit lines extending through the array 802 corresponding to respective column addresses. The row address decoder 810 is connected to word line driver 812 that activates respective rows of memory cells in the array 802 corresponding to received row addresses. The selected data line (e.g., a bit line or bit lines) corresponding to a received column address are coupled to a read/write circuitry 814 to provide read data to a data output buffer 816 via an input-output data bus 815. Write data are applied to the memory array 802 through a data input buffer 818 and the memory array read/write circuitry 814.

The memory 800 may include an apparatus 850 that may be implemented as one or more of the apparatuses described herein. As illustrated, in some examples the apparatus 850 may be included in the column decoder 808. In another example, the apparatus 850 may be included in the command decoder 804. In yet another example, the apparatus 850 may be included in the memory array 802. In yet another example, portions of the apparatus 850 may be included in one or more elements of the memory 800. A column address circuit of the apparatus 850 may, for instance, be included in the command decoder and memory banks of the apparatus 850 may be included in the memory array 802.

Description has been made herein with respect to signal timings, for instance, during both non-sequential and simultaneous operations. It will be appreciated by those having ordinary skill in the art that signal timings, in at least some examples, are directed to signal timings internal to a memory and not at external pins of the memory.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

The particular embodiments disclosed above are intended to be illustrative only, as the disclosed subject matter may be modified and practiced in different but equivalent manners apparent to those having ordinary skill in the art and the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the invention is not limited except as by the appended claims.

What is claimed is:

1. An apparatus, comprising:
    a memory bank;
    a local buffer circuit associated with the memory bank; and
    an address control circuit coupled to the memory bank and configured to receive a command and an address associated with the command, the address control circuit comprising:
        a latency circuit configured to receive the command and to assert a first control signal and a second control signal responsive to receipt of the command; and
        a global buffer circuit configured to store the address, the address control circuit configured to delay the command using one of a plurality of command paths based, at least in part, on a write latency, the global buffer circuit configured to store the address responsive to the first control signal being asserted, the global buffer circuit configured to provide the address stored in the global buffer circuit to the local buffer circuit to be stored therein, and
        wherein the local buffer circuit is configured to store the address in the local buffer circuit responsive to the second control signal being asserted.

2. The apparatus of claim 1, wherein during an operation associated with the command, the address control circuit is further configured to assert the first control signal if the operation is a masked write operation and to assert the second control signal if the operation is a write operation.

3. The apparatus of claim 1, wherein the address control circuit is further configured to delay the command using the one of the plurality of command paths based on a type of the command.

4. The apparatus of claim 1,
    wherein the global buffer circuit is coupled to the latency circuit and configured to receive the address and the first control signal.

5. The apparatus of claim 4, wherein the address control circuit is further configured to assert the second control signal responsive to receipt of the command, and wherein the local buffer circuit associated with the memory bank is configured to receive the second control signal.

6. The apparatus of claim 1, wherein the command is a masked write command.

7. An apparatus, comprising:
an address control circuit comprising:
a latency circuit configured to receive a command and to assert a first control signal and a second control signal responsive to receipt of the command; and
a global buffer circuit coupled to the latency circuit and configured to receive the first control signal and an address associated with the command, the global buffer circuit configured to store the address responsive to the latency circuit asserting the first control signal; and
a local buffer circuit coupled to the latency circuit and the global buffer circuit, the local buffer circuit associated with a memory bank and configured to receive the second control signal and the address and configured to store the address responsive to the latency circuit asserting the second control signal.

8. The apparatus of claim 7, wherein the address is a first address and wherein the global buffer circuit is configured to provide the first address responsive to storing the first address, the global buffer circuit further configured to receive the second control signal and to provide a second address responsive to the second control signal no longer being asserted.

9. The apparatus of claim 8, wherein the latency circuit is further configured to receive the address and to assert the second control signal based on the address.

10. The apparatus of claim 8, wherein the local buffer circuit is further configured to automatically provide the address to a local column address bus when no other addresses are stored in the local buffer circuit.

11. The apparatus of claim 8, wherein the local buffer circuit is a first local buffer circuit and the address is a first address, the apparatus further comprising:
a second local buffer circuit coupled to the latency circuit and the global buffer circuit and configured to store a second address responsive to the latency circuit asserting a third control signal.

12. The apparatus of claim 8, wherein the command is a masked write command.

13. The apparatus of claim 8, wherein the apparatus is included in a memory.

14. An apparatus, comprising:
an address control circuit configured to receive a write command and a masked write command for a memory bank of the plurality of memory banks, the write command provided to the address control circuit before the masked write command, and the address control circuit configured to receive an address associated with each of the commands and indicative of the memory bank of a plurality of memory banks, the address control circuit further configured to provide the address to a local buffer circuit associated with the memory bank of the plurality of memory banks and to assert a first control signal associated with the memory bank of the plurality of memory banks prior to a write operation associated with the write command being performed and to assert a second control signal during the write operation associated with the write command,
wherein the local buffer circuit provides the address as a local address responsive to the first control signal being asserted and provides a new address as the local address responsive to the second control signal no longer being asserted, and
wherein the address control circuit is configured to delay the masked write command such that a write operation associated with the write command is performed prior to a read operation associated with the masked write command.

15. The apparatus of claim 14, wherein the local buffer associated with the memory bank of the plurality of memory banks is configured to store the address responsive to the first control signal being asserted.

16. The apparatus of claim 14, wherein the address control circuit is further configured to provide the address a number of clock cycles after receiving the write command.

17. The apparatus of claim 14, wherein the address control circuit includes a global buffer circuit configured to store addresses associated with respective write and masked write commands and for the plurality of memory banks.

18. The apparatus of claim 14, wherein the address control circuit is further configured to provide the address to the memory bank of the plurality of memory banks responsive to receipt of the address when the address control circuit is not storing any other addresses.

19. The apparatus of claim 14, wherein the address control circuit is configured to store the address in a FIFO buffer.

20. An apparatus, comprising:
an address control circuit configured to receive a write command associated with a memory bank and a masked write command associated with the memory bank, the write command provided to the address control circuit before the masked write command, and the address control circuit configured to delay the write command a first amount using a first command path and to delay the masked write command a second amount using a second command path, the address control circuit further configured to assert a control signal of a first plurality of control signals during an operation associated with the write command and to assert a control signal of a second plurality of control signals during an operation associated with the masked write command,
wherein each control signal of the first plurality of control signals is associated with a respective memory bank of a plurality of memory banks and wherein each control signal of the second plurality of control signals is associated with a respective memory bank of the plurality of memory banks, and
wherein the address control circuit is configured to delay the masked write command such that a write operation associated with the write command is performed prior to a read operation associated with the masked write command.

21. The apparatus of claim 20, wherein the write and masked write commands are associated with a same memory bank.

22. The apparatus of claim 20, wherein the address control circuit is configured to delay the write command the first amount based on a write latency and to delay the masked write command the second amount based on the write latency.

23. The apparatus of claim 20, wherein the operation associated with the masked write command includes a read operation and wherein the operation associated with the write command includes a write operation.

24. A method, comprising:
  delaying a write command of a first type using a first command path;
  delaying a masked write command of a second type using a second command path;
  asserting a control signal of a first plurality of control signals during an operation of a first type associated with the write command, each of the plurality of control signals associated with a respective memory bank of a plurality of memory banks;
  asserting a control signal of a second plurality of control signals during an operation of a second type associated with the masked write command, each of the plurality of control signals associated with a respective memory bank of the plurality of memory banks, and
  delaying the masked write command such that a write operation associated with the write command is performed prior to a read operation associated with the masked write command.

25. The method of claim 24, wherein delaying a command of a first type using a first command path comprises delaying the write command of the first type by a first amount based on a write latency and wherein delaying the masked write command of a second type using a second command path comprises delaying the command of the second type by a second amount based on the write latency.

26. The method of claim 24, wherein delaying a command of a first type using a first command path comprises delaying a masked write command and delaying a command of a second type using a second command path comprises delaying a masked write command or a write command.

27. The method of claim 24, further comprising:
  asserting another control signal of the first plurality of control signals during an operation of the first type associated with the second command.

28. The method of claim 24, wherein asserting a control signal of a first plurality of control signals during an operation of a first type associated with the first command, each of the plurality of control signals associated with a respective memory bank of a plurality of memory banks comprises asserting the control signal of the first plurality of control signals based on an address.

29. The method of claim 24, further comprising:
  delaying the command of the second type using the first command path.

30. The method of claim 24, wherein asserting a control signal of a second plurality of control signals during an operation of a second type associated with the second command, each of the plurality of control signals associated with a respective memory bank of the plurality of memory banks comprises:
  asserting the control signal of the second plurality of control signals while the control signal of the first plurality of control signals is asserted.

31. A method comprising:
  receiving a write command and a masked write command, the write command provided to the address control circuit before the masked write command;
  storing addresses associated with the write and masked write commands at a global buffer circuit;
  providing an address stored in the global buffer circuit to a plurality of local buffer circuits, each of the plurality of local buffer circuits associated with a respective memory bank;
  storing the address at a local buffer circuit of the plurality of local buffer circuits associated with the memory bank corresponding to the address;
  providing the address stored at the local buffer circuit of the plurality of local buffer circuits to the respective memory bank as a local address; and
  delaying the masked write command such that a write operation associated with the write command is performed prior to a read operation associated with the masked write command.

32. The method of claim 31 wherein providing the address stored in the global buffer circuit to a plurality of local buffer circuits and storing the address at a local buffer circuit of the plurality of local buffer circuits associated with the memory bank corresponding to the address are responsive to respective control signals.

33. The method of claim 31, wherein providing an address comprises providing a first address, the method further comprising:
  providing a second address stored in the global buffer circuit to the plurality of local buffer circuits;
  storing the second address at a second local buffer circuit of the plurality of local buffer circuits associated with the memory bank corresponding to the second address; and
  providing the second address stored at the second local buffer circuit of the plurality of local buffer circuits to the respective memory bank as a second local address.

* * * * *